United States Patent
Burrell et al.

(10) Patent No.: US 7,294,565 B2
(45) Date of Patent: Nov. 13, 2007

(54) METHOD OF FABRICATING A WIRE BOND PAD WITH NI/AU METALLIZATION

(75) Inventors: Lloyd G. Burrell, Poughkeepsie, NY (US); Charles R. Davis, Fishkill, NY (US); Ronald D. Goldblatt, Yorktown Heights, NY (US); William F. Landers, Wappingers Falls, NY (US); Sanjay C. Mehta, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/676,172

(22) Filed: Oct. 1, 2003

(65) Prior Publication Data

US 2005/0074959 A1    Apr. 7, 2005

(51) Int. Cl.
*H01L 21/28* (2006.01)
*H01L 23/48* (2006.01)

(52) U.S. Cl. ............... 438/582; 438/612; 438/614; 438/617; 438/648; 257/763; 257/765; 257/770

(58) Field of Classification Search ........ 438/612–614, 438/622–625
See application file for complete search history.

(56) References Cited

U.S. PATENT DOCUMENTS

| | | | | |
|---|---|---|---|---|
| 4,690,746 A | * | 9/1987 | McInerney et al. | 204/192.32 |
| 4,696,098 A | * | 9/1987 | Yen | 438/642 |
| 5,635,253 A | * | 6/1997 | Canaperi et al. | 427/437 |
| 6,174,823 B1 | * | 1/2001 | Dobson et al. | 438/778 |
| 6,180,505 B1 | * | 1/2001 | Uzoh | 438/614 |
| 6,239,494 B1 | * | 5/2001 | Besser et al. | 257/762 |
| 6,274,935 B2 | * | 8/2001 | Uzoh | 257/762 |
| 6,306,751 B1 | * | 10/2001 | Patel et al. | 438/614 |
| 6,350,667 B1 | * | 2/2002 | Chen et al. | 438/612 |
| 6,376,353 B1 | * | 4/2002 | Zhou et al. | 438/612 |
| 6,403,457 B2 | * | 6/2002 | Tandy | 438/613 |
| 6,451,681 B1 | * | 9/2002 | Greer | 438/601 |
| 6,548,327 B2 | * | 4/2003 | De Pauw et al. | 438/118 |
| 6,713,381 B2 | * | 3/2004 | Barr et al. | 438/622 |
| 6,733,823 B2 | * | 5/2004 | Lee et al. | 216/13 |
| 2003/0054633 A1 | * | 3/2003 | Lee et al. | 438/655 |
| 2005/0032348 A1 | * | 2/2005 | Farnworth et al. | 438/613 |

\* cited by examiner

*Primary Examiner*—Alonzo Chambliss
(74) *Attorney, Agent, or Firm*—Scully, Scott, Murphy & Presser, P.C.; Kerry B. Goodwin, Esq.

(57) ABSTRACT

A method for sealing an exposed surface of a wire bond pad with a material that is capable of preventing a possible chemical attack during electroless deposition of Ni/Au pad metallurgy is provided. Specifically, the present invention provides a method whereby a TiN/Ti or TiN/Al cap is used as a protective coating covering exposed surfaces of a wire bond pad. The TiN/Ti or TiN/Al cap is not affected by alkaline chemistries used in forming the Ni/Au metallization, yet it provides a sufficient electrical pathway connecting the bond pads to the Ni/Au pad metallization.

20 Claims, 9 Drawing Sheets

METHOD OF FABRICATING A WIRE BOND PAD WITH NI/AU METALLIZATION

BACKGROUND OF THE INVENTION

The present invention relates to semiconductor device packaging, and more particularly to a process to seal the interfaces of wire bond pads, such as aluminum (Al) wire bond pads, thus preventing attack of the bond pads during the subsequent electroless plating of Ni/Au.

BACKGROUND OF THE INVENTION

In semiconductor manufacturing, a fabricated integrated circuit (IC) is usually assembled into a package to be utilized on a printed circuit board as part of a much larger circuit. In order for the leads of the board to make electrical contact with the bonding pads of the IC device, a metal bond, or wire, is formed to make a connection between the bond pad of an IC device and the lead extending to the package lead frame, or solder ball connection to a ceramic or polymeric chip.

As the industry migrates to smaller and smaller size chips, finer pitch wire-bonding is required. The amount of probing damage as a result of the "scrubbing" that is necessary to remove the native oxide on the Al wire bond pads causes a poor wire-bonding surface: Also, the force that is required for "scrubbing" Al bond pads and then consequently the bonding to the damaged area is not suitable for a low dielectric constant, i.e., low-k, interconnect structure. Therefore, a different metallurgy is now required for fine pitch and low-k wire-bond applications.

One proposed noble pad metallurgy that can be used for fine pitch and low-k wire-bond applications is nickel/gold, i.e., Ni/Au. Ni/Au pad metallization provides improved wire-bondability and reliability in such applications.

There are two principal approaches available for plating Ni/Au, i.e., electrolytic and electroless plating. Electroless plating, owing to its distinct advantages such as plating selectivity, ease of processing, and compatibility with the current integration scheme, is used as a preferred method for plating Ni/Au in the present invention.

The process for plating electroless Ni/Au pad metallurgy requires the use of alkaline chemistries that could potentially cause the aluminum wire bond pad to be etched out due to the penetration of alkaline chemistry through the sidewalls of wire bond pads in the current integration scheme. While electroless nickel chemistry is acidic (pH of between 3-5), the most commonly used electroless gold chemistry in the printed circuit board industry is cyanide based, which operates in high pH ranges (pH>10). The other acidic based non-cyanide electroless gold chemistries, while available, are less stable, and present real manufacturability concerns.

To date, no viable means has been developed for protecting Al wire bond pads from such a chemical attack. A method is thus needed for providing a way to prevent the potential chemical attack of Al wire bond pads during the electroless plating of Ni/Au. Such a method should be compatible with existing packaging methods thereby not significantly altering the standard packaging processes.

SUMMARY OF THE INVENTION

The present invention provides a method for sealing any exposed aluminum surface of a wire bond pad thereby preventing a possible chemical attack during the deposition of Ni/Au pad metallurgy. Specifically, the present invention provides a method whereby a metallic cap that is resistant to alkaline chemistry is used as a protective coating covering exposed surfaces of the wire bond pad. The metallic cap is not affected by alkaline chemistries used in forming the Ni/Au pad metallization, yet it provides a sufficient electrical pathway connecting the wire bond pads to the Ni/Au pad metallization. In accordance with the present invention, the metallic cap can comprise TiN/Ti or TiN/Al.

In broad terms, the method of the present invention comprises the steps of:

providing a structure having at least one wire bond pad in contact with a metal line of an interconnect structure, said at least one wire bond pad having an exposed surface portion;

forming a metallic cap on at least the exposed upper surface portion of the wire bond pad, said metallic cap is resistant to alkaline chemistries; and forming Ni/Au metallization on said metallic cap.

The wire bond pads that can be employed in the present invention include any conductive wire bond pad such as W, Al, Ta, Cu, and alloys thereof. Although the method of the present invention can be used with these various conductive wire bond pads, it is particularly useful in protecting Al wire bond pads from chemical attack during the subsequent deposition of the Ni/Au pad metallization.

The method of the present invention comprises two different embodiments in which the metallic cap is formed. In the first embodiment, the metallic cap is formed on the exposed surface portion of the wire bond pad through an opening formed in overlying passivation layers. In this embodiment, some sidewall portions of the overlying passivation layers are also lined with the metallic cap. In the first embodiment, the metallic cap can comprise TiN/Ti or TiN/Al. In a second embodiment of the present invention, the metallic cap is formed atop the entire upper surface of the wire bond pad prior to forming overlying patterned passivation layers that have an opening therein. The Ni/Au pad metallurgy is then formed directly atop the metallic cap through the opening in the overlying passivation layers. It is noted that the metallic cap employed in the present invention is a material that is resistant to alkaline attack during the subsequent electroless deposition of Ni/Au pad metallurgy.

In addition to a method, the present invention also provides a semiconductor structure in which the wire bond pads are not etched out during the electroless plating of Ni/Au pad metallurgy. In broad terms, the structure of the present invention comprises:

an interconnect structure containing an upper interconnect level having one or more metal lines, each metal line having a wire bond pad located on a surface thereof;

a metallic cap that is resistant to alkaline chemistries on a surface of the wire bond pad; and Ni/Au pad metallurgy atop said metallic cap, said Ni/Au pad metallurgy is in electrical contact with said wire bond pad through said metallic cap.

DETAILED DESCRIPTION OF THE INVENTION

Figure 1A:
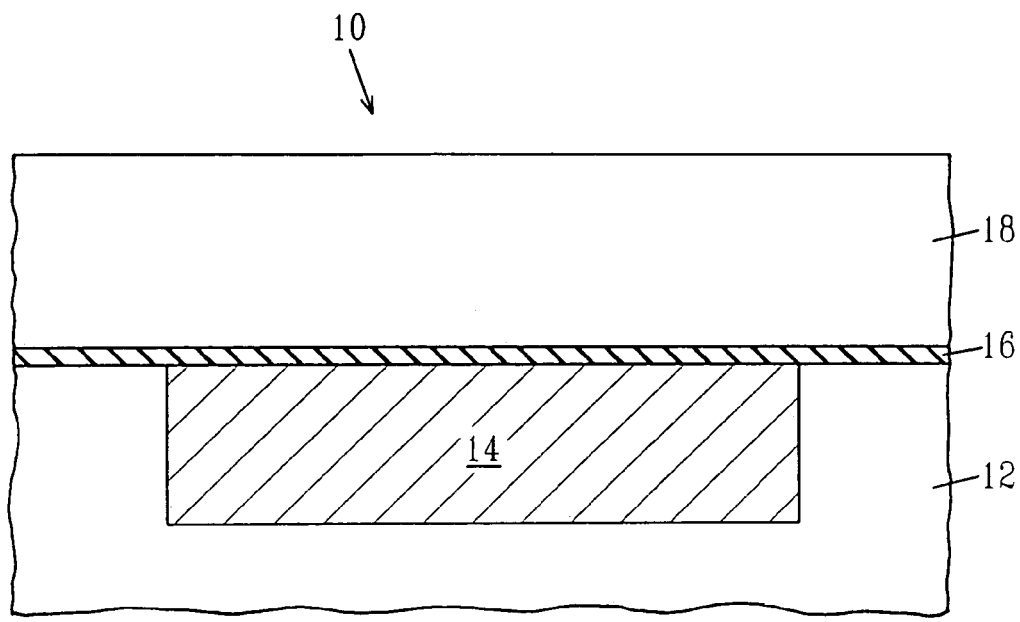
FIGS. 1A-1H are pictorial representations (through cross sectional views) illustrating a first embodiment of the present invention. These schematics are not drawn to scale.
Figure 1B:
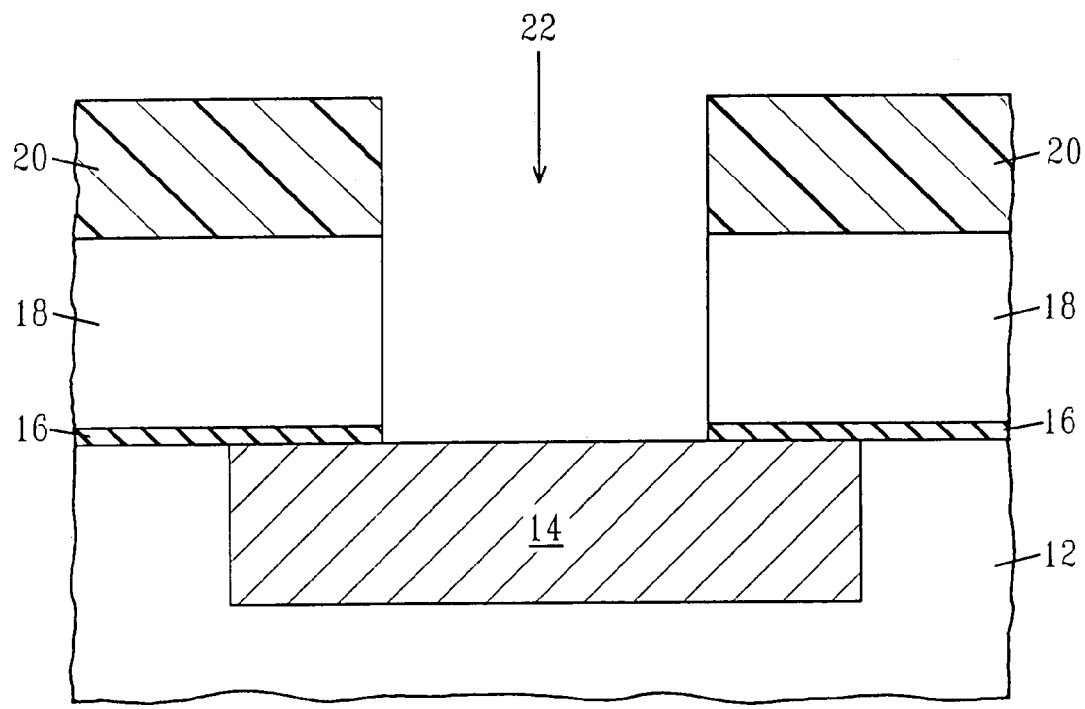

The present invention, which provides a method for protecting wire bond pads against chemical attack during formation of Ni/Au metallurgy, will now be described in greater detail by referring to the drawings that accompany the present application. In the accompanying drawings, like and/or corresponding elements are referred to by like reference numerals. Although the drawings and description that follow illustrate and discuss the presence of a single metal line, a single wire bond pad and a single Ni/Au pad metallization, the present invention is not limited thereto. Instead, the present invention can be used when any number of the foregoing elements is present in the structure. Moreover, the drawings of the present invention illustrate only the upper wiring level of an interconnect structure. Despite this illustration, the present invention contemplates using interconnect structure having a plurality of wiring levels, each stacked on top of each other.

Referring to FIGS. 1A-1H there is shown a first embodiment of the present invention. In this embodiment of the present invention, a metallic cap of either TiN/Ti or TiN/Al is formed after various passivation layers having an opening therein have been formed atop a wire bond pad. The opening in the passivation layers overlying the wire bond pad exposes a surface portion of the wire bond pad. At least the exposed surface portion of the bond pad is protected with the metallic cap and thereafter Ni/Au metallization is formed atop the metallic cap within the opening in the dielectric layers.

FIG. 1A illustrates a simple view of an uppermost interconnect level 10 of an interconnect structure. As shown in FIG. 1A, the uppermost interconnect level 10 comprises a patterned dielectric material 12 having a metal line 14 formed therein. The interconnect structure shown in FIG. 1A may be formed utilizing a conventional single or dual damascene process, both of which are well known to those skilled in the art. The uppermost interconnect level 10 also includes a dielectric cap layer 16 located on top of the patterned dielectric material 12 and metal line 14 and a lower passivation layer 18 located atop the dielectric cap layer 16.

The patterned dielectric material 12 is comprised of one or more insulating materials including, for example, an oxide, an organo-silicate glass or an organic or inorganic low-dielectric constant material (k is less than 4.0). The patterned dielectric material 12 may be non-porous or porous. The metal line 14 (or metallization layer) is composed of a conductive metal such as Al, Cu, W, Ni, and other like conductors including alloys, suicides and conductive oxynitrides of the aforementioned conductive metals. Diffusion barrier liners such as, for example, TaN, Ta, TiN(Si), separating the metal line from the surrounding dielectric may also be present in the interconnect structure. One highly preferred conductive metal for metal line 14 is Cu.

Dielectric cap layer 16 is then formed atop the patterned dielectric material 12 and the metal line 14 utilizing a conventional deposition process such as chemical vapor deposition (CVD), plasma-enhanced chemical vapor deposition (PECVD), evaporation, atomic layer deposition, chemical-solution deposition or another like deposition process. Dielectric cap layer 16 is comprised of an oxide, nitride, oxynitride, carbide or any combination thereof. In one preferred embodiment of the present invention, the dielectric cap layer 16 is comprised of nitride. The thickness of the dielectric cap layer 16 may vary, but typically the dielectric cap layer 16 has a thickness of from about 30 to about 350 nm.

Lower passivation layer 18 is then formed atop dielectric cap layer 16 utilizing a conventional deposition process including any of the deposition processes used in forming the dielectric cap layer 18. Lower passivation layer 18 is comprised of a dielectric material such as an oxide, nitride, or oxynitride. Note that the dielectric cap layer 16 and the lower passivation layer 18 are composed of different dielectric materials. Taken together layers 16 and 18 represent the interconnect passivation layers. Lower passivation layer 18 is a thick layer having a thickness of from about 8000 to about 25,000 Å.

After providing the structure shown in FIG. 1A, a photoresist is applied atop the lower passivation layer 18 and then the photoresist is patterned utilizing lithography. The lithography step includes exposing the photoresist to a pattern of radiation and developing the photoresist utilizing a conventional resist developer. The first patterned photoresist employed in the present invention is labeled as 20 in FIG. 1B. Next, a via 22 is formed into the lower passivation layer 18 and the dielectric cap layer 16 stopping on an upper surface of the metal line 14. The via 22 is formed by a conventional etching process. The etching process used in forming via 22 may be a dry etching process, such as, reactive-ion etching (RIE), ion beam etching, plasma etching or laser ablation. Alternatively, the via 22 may be formed by a wet etching process wherein a chemical etchant that selectively removes dielectric material is employed. Any combination of the aforementioned etching process may be employed in the present invention in forming the via 22.

After etching, the exposed portion of the metal line 14 is optionally cleaned utilizing a conventional cleaning process. Specifically, dilute hydrofluoric acid may be used to clean the exposed surface of the metal line 14. Following the etching process, or, after the optionally cleaning step, the patterned photoresist 20 is removed from the structure utilizing a conventional stripping process well known to those skilled in the art.

A barrier 24 that is resistant to metal diffusion is then formed atop the exposed surfaces of the etched lower passivation layer 18 and the metal line 14 utilizing a conformal deposition process such as, for example, sputtering, CVD, physical vapor deposition (PVD), plating and other like deposition processes. The barrier 24 may comprise a single barrier material or a combination of barrier materials may be used as barrier 24. Barrier 24 can be comprised of Ti, TaN, TiN, Ta, Cr, W and combinations thereof. One highly preferred barrier 24 that is employed in the present invention is a stack of TaN/Ti/TiN. Another is a stack of TiN/Ti.

The thickness of the barrier 24 may vary depending on the number of materials and technique in forming the same. Typically, however, the barrier 24 has a thickness of from about 500 to about 2000 Å, with a thickness of from about 750 to about 1000 Å being more highly preferred.

In accordance with the next step of the present invention, a metal layer 26 is formed atop the entire length of the barrier 24. The metal layer 26 can comprise any conductive material including, for example, Al, Ta, Cu, W and combinations thereof including alloys, such as Al—Cu. Although the method of the present invention can be used with these various conductive materials, it is particularly useful in protecting Al from chemical attack during the subsequent deposition of the Ni/Au pad metallization. The Al layer 26 may comprise elemental Al or an alloy of Al such as Al—Cu. Note the metal layer 26 will be subsequently patterned and etched into a wire bond pad.

The thickness of the metal layer 26 may vary depending on the process used in forming the same as well as the type of conductive material being deposited. Typically, the metal layer 26 has a thickness of from about 5000 to about 20,000 Å, with a thickness of from about 10,000 to about 12,000 Å being more preferred. The metal layer 26 may be formed utilizing any of the above-described techniques useful in forming the barrier 24. Typically, sputtering is the preferred means for depositing the metal layer 26.

Figure 1C:
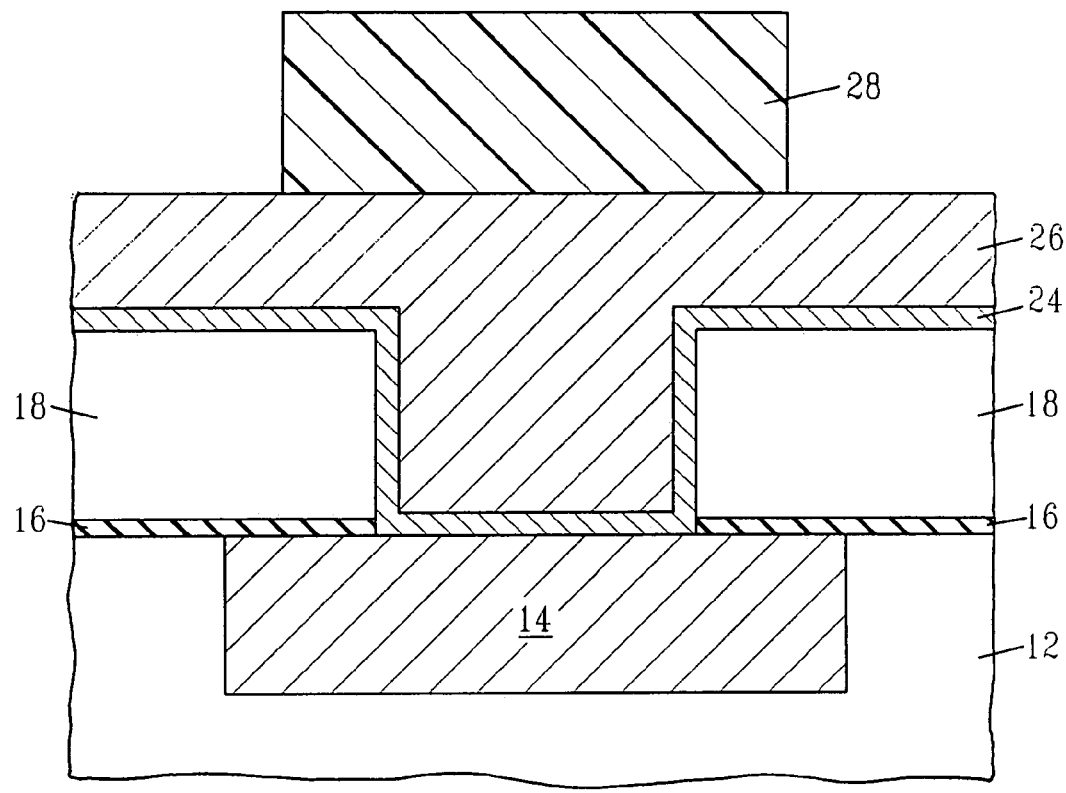

Next, a second patterned photoresist 28 is formed atop a portion of the metal layer 26 utilizing deposition and then lithography, i.e., exposing the applied photoresist to a pattern of radiation and developing the pattern utilizing a conventional resist developer. FIG. 1C is an illustration of a structure that includes barrier 24, metal layer 26 and second patterned photoresist 28.

The exposed portions of the metal layer 26 and underlying barrier 24, not protected by the second patterned photoresist 28, are then removed utilizing a conventional etching process that selectively removes metal as compared to dielectric material. The etching step may comprise a dry etching process such as reactive-ion etching (RIE), ion beam etching, plasma etching or laser ablation. Alternatively, a wet chemical etching process may be used in selectively removing the exposed portions of the metal layer 26 and underlying barrier 24. In addition to using either a dry etching process or a wet chemical etching process, the present invention also contemplates utilizing a combination thereof. A single etching step may be used in which the exposed portions of the metal layer 26 and underlying barrier 24 is removed at the same time, or two different etching steps may be employed wherein the exposed portions of the metal layer 26 are first removed stopping on the barrier 24 and then the exposed portions of the barrier 24 are removed using a second etch. The etching stops atop lower the passivation layer 18.

Figure 1D:
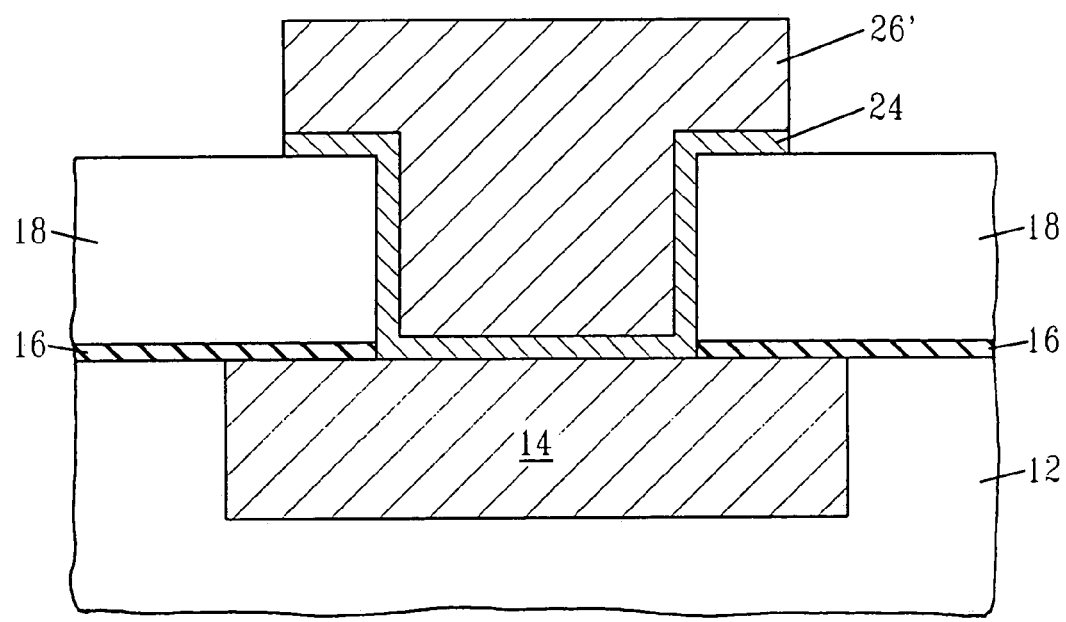

After etching, the second patterned photoresist 28 is removed utilizing a conventional resist stripping process providing the structure shown, for example, in FIG. 1D. In FIG. 1D, the patterned metal layer may now be referred to as wire bond pad 26'. Following the resist stripping process, the upper surface of the wire bond pad 26' may be optionally cleaned/pretreated at this point of the present invention utilizing conventional processes well known to those skilled in the art.

Figure 1E:
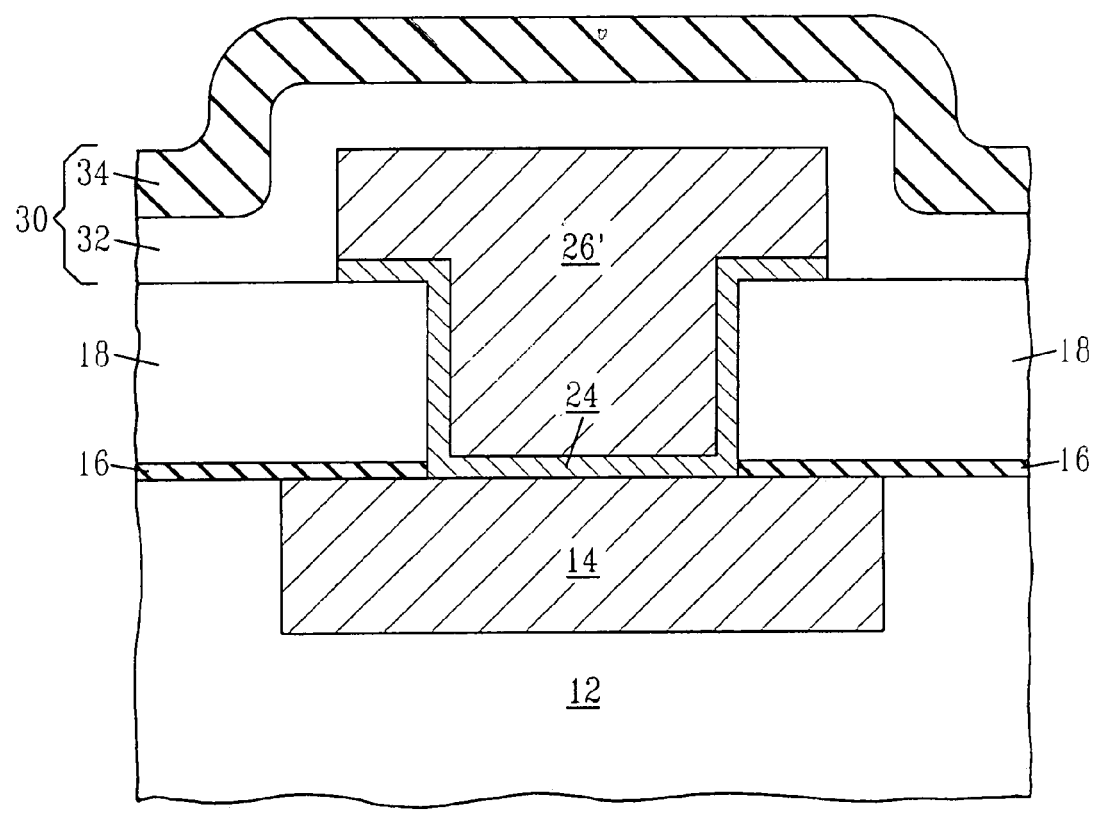
Figure 1F:
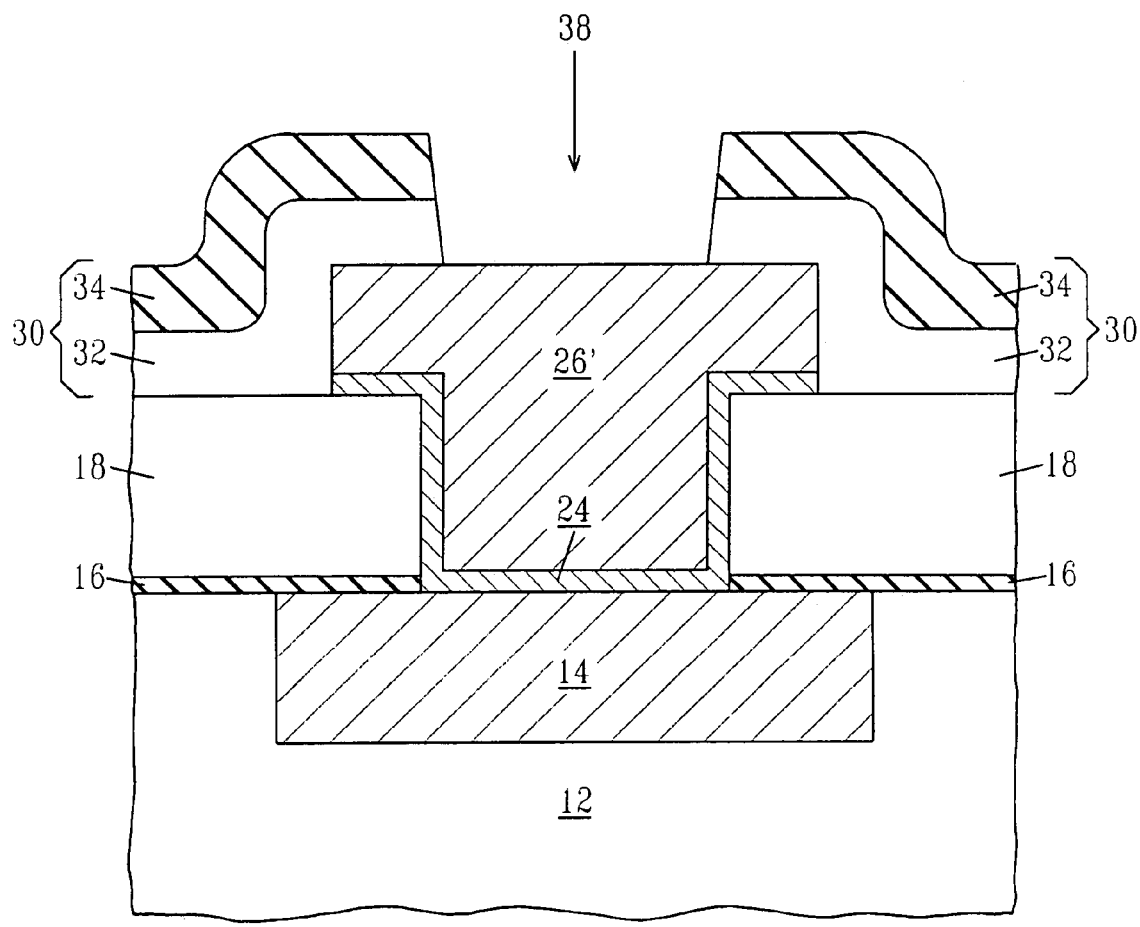

Lower portions of passivation stack (inorganic, organic or a combination thereof) 30 are then formed atop the structure shown in FIG. 1D; an upper portion of the passivation stack 30 may be formed at a latter point of the present invention. The lower portions of passivation stack 30 may comprise any number of passivating layers. FIG. 1E shows an example where the lower portion of passivation stack includes two inorganic materials. In the embodiment illustrated, the first layer of the passivation stack 30 is oxide layer 32, and the second layer of the passivation stack 30 is nitride layer 34. A third layer of the passivation stack 30 (not shown in FIG. 1E) is an organic passivation layer 36 which is formed after formation of opening 38 and formation of layers 40 and 42. Examples of suitable organic passivation layers 36 that may be employed in the present invention include polyimides or polysiloxanes.

The thickness of the passivation stack 30 (FIG. 1F) may vary depending on the number of layers present in the stack. Typically, however, the passivation stack 30 has a thickness of from about 3000 Å to about 30000 Å, with a thickness of from about 5000 Å to about 10000 Å being more typical.

The passivation stack 35 may include inorganic layers only, but preferably an organic passivation layer is used in conjunction with inorganic passivation layers. The lower passivation stack 30 is formed utilizing conventional deposition processes well known to those skilled in the art. A PECVD based method is used to deposit oxide (layer 32) and nitride (layer 34) which form the lower passivation stack 30. The passivation stack 30 is sometimes referred to in the art as the final passivation. Note that the final passivation completely encapsulate the wire bond pad except through opening 38 (to be discussed next).

An opening 38 is then formed into the passivation stack 30, e.g., layers 32 and 34, to expose a surface portion of wire bond pad 26'. This structure is shown, for example, in FIG. 1F. Specifically, opening 38 is formed by lithography, and etching of the photoresist. The etching step used at this point of the present invention includes a dry etching process such as RIE.

Figure 1G:
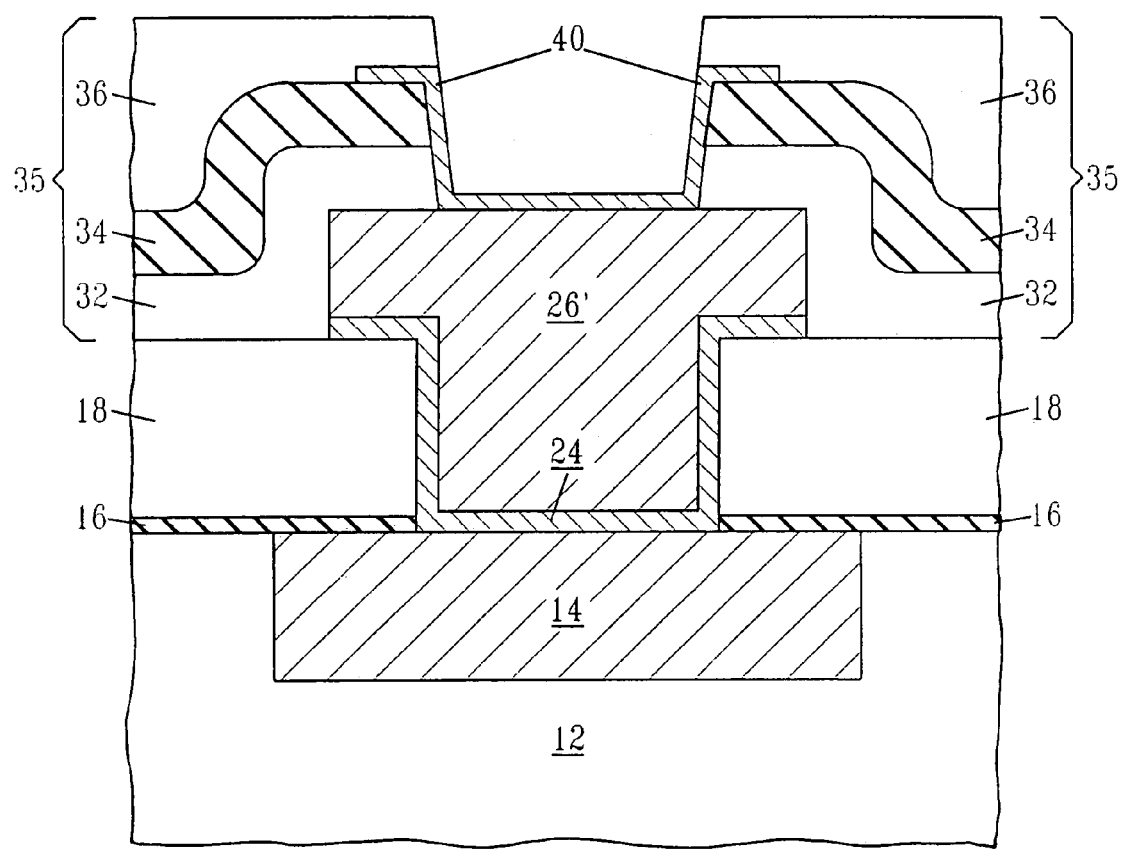

After providing the opening 38, a metallic cap 40 is formed on at least one of the exposed surface portions of the wire bond pad 26'. In some embodiments, the metallic cap stack 40 is also formed on the exposed sidewalls of the etched inorganic passivation layers. This particular embodiment is shown in FIG. 1G. As shown, the metallic cap 40 extends onto a top portion of layer 34.

The metallic cap 40 is comprised of a metallic material that is resistant to attack by alkaline chemistries. The metallic cap may comprise either TiN/Ti or TiN/Al. The metallic cap 40 is formed by first depositing TiN as a seed layer utilizing a conventional deposition process such as sputtering or CVD. The TiN seed layer is a thin layer having a thickness of about 500 Å or less. Next, Ti or Al is sputter deposited atop the TiN seed layer. The thickness of the Ti or Al layer is typically about 5000 Å, but less than 10,000 Å. Note that in the drawings the TiN seed layer and the Ti or Al layer are represented by a single layer denoted as 40.

A patterned mask is formed so as to protect the metallic cap 40 in the opening and any exposed metallic cap 40 is removed utilizing an etching process that selectively removes that metallic from the structure.

The top passivation layer is formed above the lower passivation stack 30. This passivation layer is made from a photosensitive organic material. It is spin coated, exposed, cured and developed to open up the Al or Ti pad metallurgy by techniques known to those skilled in the art. The typical thickness of the patterned organic passivation layer (35) post-cure is 60000 Å.

The exposed metal (Al or Ti) of the bond pad(s) is pre-treated before nickel deposition. There are different clean/pretreatment steps depending on whether the top layer of metallic cap 40 is comprised of Ti or Al. In cases wherein Al is the top layer of the metallic cap 40, and since Al surfaces tend to oxidize in atmosphere, the clean/pretreatment step should ensure complete removal of native oxides and protect the Al surfaces against future oxidation. In the Al case, one preferred clean/pretreatment step that is employed is as follows: First, an acid etch is performed at, or close to, room temperature to micro-etch the Al surface for improved adhesion. Following the acid etch, the surface is rinsed with water and the micro-etched surface of Al is then treated with a first solution of zincate containing ZnO and NaOH as major components. The first solution of zincate has a pH of from 10 to 14, and the first treatment occurs at about room temperature by immersing the surface to be cleaned into the first zincate solution for a time period of from about 15 seconds to about 120 seconds, with a time period of from about 30 seconds to about 60 seconds being more typical.

Although the conventional zincate chemistry is highly alkaline in nature, the chemistry can be modified by adjusting the pH and the reaction time to have a controlled reaction with Al, while ensuring uniform Zn coverage.

Zincate is used to primarily displace a surface portion of Al with a thin, continuous coating of Zn that protects the virgin Al from oxidation. Typically, the first zincate film formed is non-uniform with a coarse grained spongy morphology of Zn. Hence, a second treatment with zincate is needed to provide the uniform coating.

After first zincate treatment, an acid such as $HNO_3$ (50% vol.) is used to partially remove the Zn film deposited from the first zincate treatment. The immersion time is typically from about 15 seconds to about 30 seconds. Next, a second zincate treatment is used, pH of from about 10 to about 14, immersion time about 15 seconds to about 120 seconds, with an immersion time of about 30 seconds to about 60 seconds being more typical. The second zincate treatment leaves behind a very thin (on the order of about 100 nm) continuous and uniform film of Zn on the Al surface that ensures uniform nucleation of Ni in a subsequent Ni deposition step. For clarity, the thin layer of Zn is not shown in the drawings. In summary, the pretreatment for Al can be described as follows:

Acid Etch
First Zincate
Immersion in dilute (50% by vol.) $HNO_3$
Second Zincate Next, Ni/Au pad metallurgy 44 is formed atop the Al layer of metallic cap 40.

When the metallic cap 40 includes Ti as a top layer, the Ti must be activated for the initiation of nickel. The pretreatment of Ti surfaces is typically performed as follows:

Cleaner—1: Alkali type (pH in the range of 7-12)
Cleaner—2: KCN type
Acid etching: HCl
Pd activator: Fluorine based:

After Ti activation, the Ni/Au pad metallurgy 44 is formed atop the activated Ti surfaces.

Figure 1H:
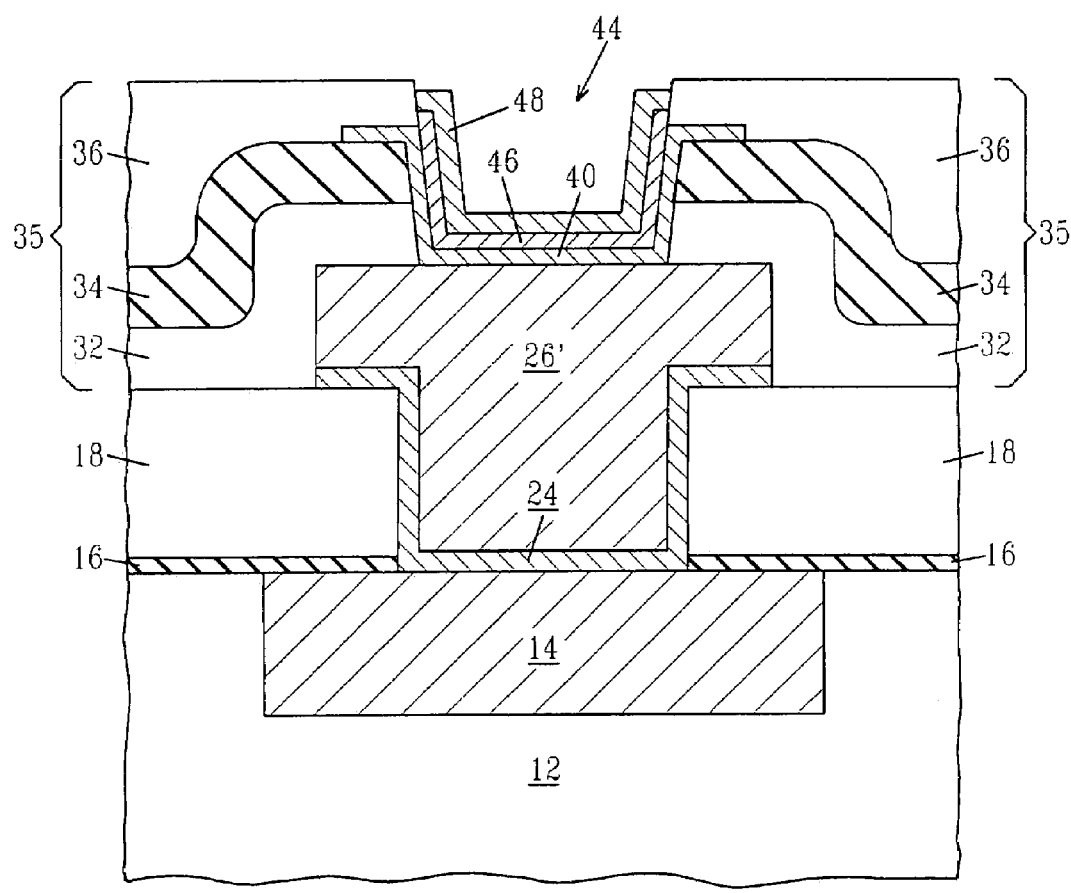

The Ni/Au pad metallurgy 44 includes Ni layer 46 (formed atop the cleaned/pretreated Al or activated Ti surface of metallic cap 40) and Au layer 48, see FIG. 1H. The Au layer 48 is comprised of two differently deposited Au layers.

The Ni/Au pad metallurgy 44 is formed by an electroless Ni deposition process followed by an Au deposition process. The electroless Ni deposition process includes a solution of Ni metal salt, such as $NiSO_4$, a reducing agent, such as sodium hypophosphite, stabilizers (typically Pb or As) and complexants. This plating solution typically has a pH of about 5. The deposition of Ni is performed at a temperature of from about 60° to about 100° C., with a temperature of from about 70° to about 90° C. being more typical. The thickness of the Ni layer 46 may vary, but typically the Ni layer 46 has a thickness of from about 3000 to about 5000 Å. The phosphorus, which forms as a by-product in the hypophosphite oxidation reaction, gets co-deposited with nickel. Typical phosphorus levels in the deposit range from 5-8 wt. % for medium phosphorus electroless nickel chemistry.

Following Ni deposition, the Au layer 48 is deposited by an immersion deposition process and then an electroless deposition process. The immersion gold deposition step is carried out to minimize nickel ion contamination in the electroless gold bath, thereby increasing the longevity of the electroless gold bath. In the immersion deposition process, a gold-containing solution having a pH of about 4.5 is provided. Immersion occurs at a temperature of about room temperature for about 1 to about 5 minutes. A self-limiting thickness of about 700 to about 1000 Å is achieved.

In the electroless Au deposition process, a gold cyanide solution having a pH of about 13-14 is employed. Deposition occurs at a temperature of from about 50° to about 70° C. for a time period of about 3 to about 5 minutes. The deposition thickness is typically from about 2500 to about 3000 Å. Despite showing a single Au layer, in reality an immersion deposited Au layer is formed first, followed by an electroless deposited Au layer.

FIGS. 1A-1H illustrate a first embodiment of the present invention. The following description, which makes reference to FIGS. 2A-2D, illustrates a second embodiment of the present invention. In the second embodiment, the metallic cap is formed atop the entire exposed surface of the wire bond pad prior to final passivation. Final passivation is then provided and an opening is formed in the final passivation. Ni/Au pad metallurgy is then formed in the opening atop the exposed metallic cap that lies above the wire bond pad. In this embodiment, the metallic cap is comprised of TiN/Ti.

The second embodiment of the present invention uses the same processes in forming the structure shown in FIG. 1C except that prior to forming the second patterned photoresist 28, TiN/Ti cap 40 is formed atop the entire surface of metal layer 26. The TiN/Ti cap 40 is formed as described above. After formation of the TiN/Ti cap 40, the patterned photoresist 28 is formed atop the TiN/Ti cap 40. This structure of the second embodiment is shown, for example, in FIG. 2A.

Figure 2A:
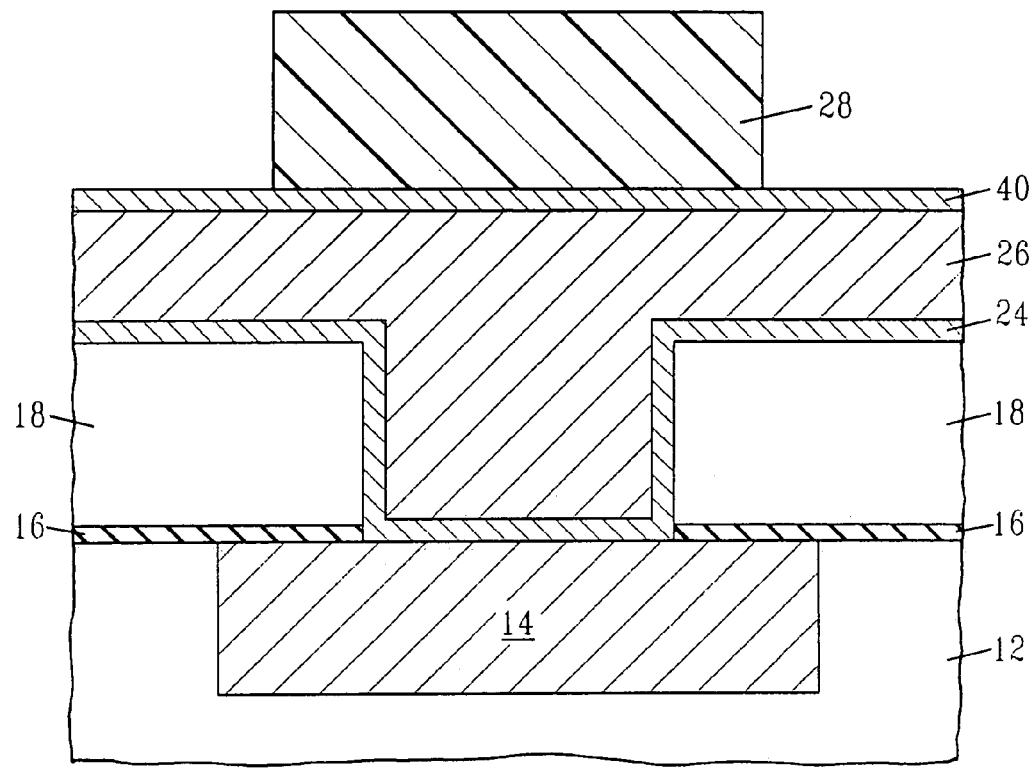
FIGS. 2A-2D are pictorial representations (through cross sectional views) illustrating a second embodiment of the present invention. These schematics are not drawn to scale.
Figure 2B:
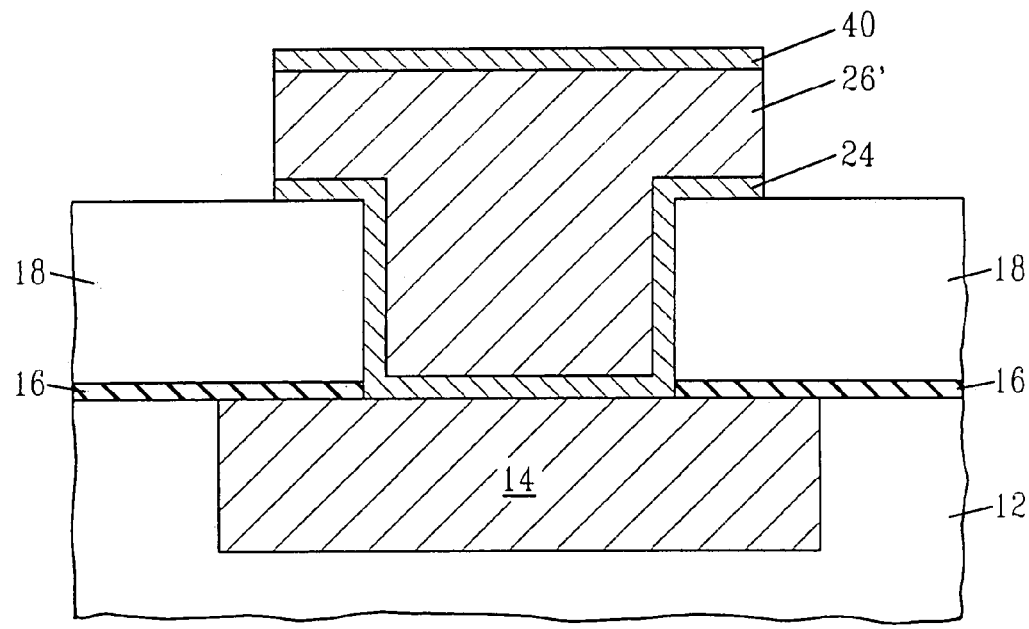

The structure shown in FIG. 2A is then etched providing the structure shown in FIG. 2B. This etching step is the same as described previously for providing the wire bond pad 26' except that the TiN/Ti cap 40 not protected by second patterned photoresist 28 is also etched. The second patterned photoresist 28 has been removed from the structure shown in FIG. 2B.

Figure 2C:
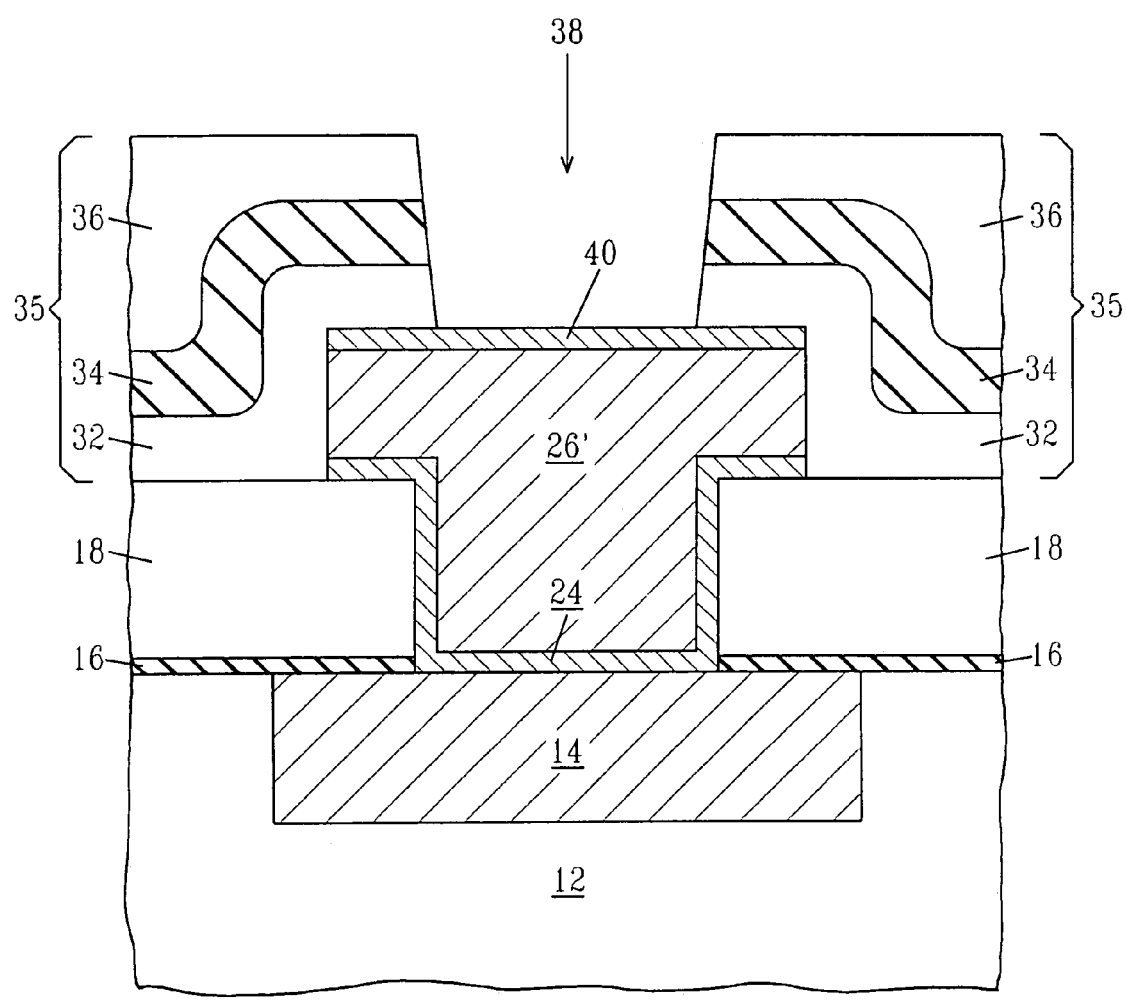
Figure 2D:
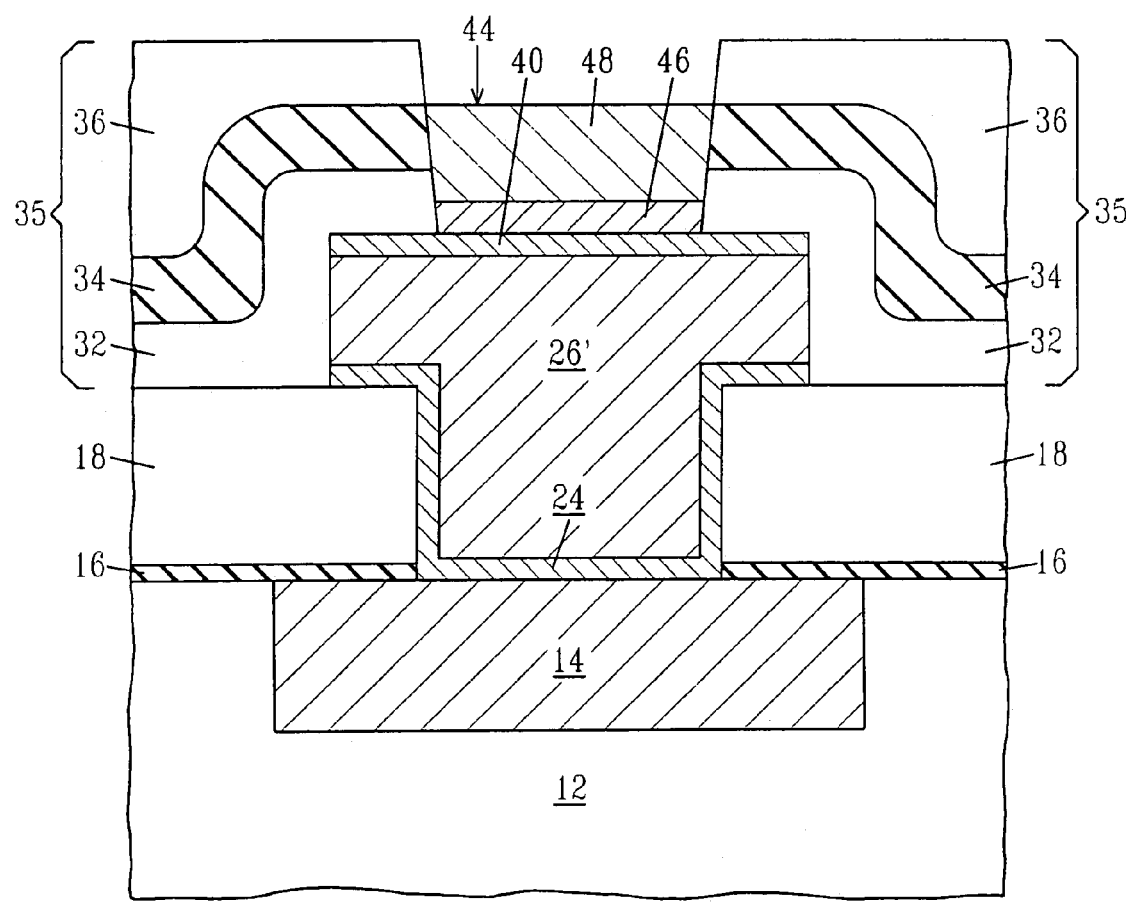

Following the foregoing patterning step, passivation stack 30 having opening 38 that exposes a portion of the TiN/Ti cap 40 above the wire bond pad 26' is formed. This structure is shown in FIG. 2C. The process steps used in forming the structure shown in FIG. 2C are the same as were used in forming the structure shown in FIG. 1D except that etching stops atop the TiN/Ti cap 40.

Next, the Ni/Au pad metallurgy 44, including Ni layer 46 and Au layer 48, is formed as described above providing the structure shown in FIG. 2D. The second embodiment of the present invention requires less processing time and fewer processing steps than the first embodiment of the present invention.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a semiconductor structure comprising:

providing a structure having at least one wire bond pad in contact with a metal line of an interconnect structure, said at least one wire bond pad having an exposed surface portion that is not protected by a passivation stack;

forming a metallic cap on at least the exposed upper surface portion of the wire bond pad, said metallic cap comprises a TiN seed layer with an Al layer atop and is resistant to alkaline attack;

performing a clean/pretreatment step on said Al layer; and forming Ni/Au metallization on said metallic cap, wherein said Ni/Au metallization comprises a Ni layer overlaid by an Au layer, wherein said Ni layer is formed by electroless deposition of Ni, and said Au layer is formed by immersion deposition of Au wherein said Ni/Au metallization and said metallic cap do not extend onto an upper surface of said passivation stack followed by electroless deposition of Au.

2. The method of claim 1 wherein th& metallic cap is formed on the exposed surface portion of the wire bond pad through an opening formed in an said passivation stack.

3. The method of claim 1 wherein the metallic cap is formed atop an entire surface of a metal layer and then the metallic cap and metal layer are selectively etched to form the metallic cap on at least the exposed upper surface portion of the wire bond pad.

4. The method of claim 1 wherein said structure further includes a barrier and a lower passivation layer of said passivation stack located atop the interconnect structure.

5. The method of claim 1 wherein the wire bond pad is comprised of Al or an aluminum alloy.

6. The method of claim 1 wherein the TiN seed layer of the metallic cap has a thickness of about 500 Å or less, and wherein the Al layer of the metallic cap has a thickness less than about 10000 Å.

7. The method of claim 1 further comprising bonding a wire to said Ni/Au metallization.

8. The method of claim 1 wherein said clean/pretreatment step removes surfaces of said Al layer and protects said surfaces against future oxidation.

9. The method of claim 1 wherein said clean/pretreatment step comprises:

performing an acid etch and micro-etching a surface of said Al layer for improved adhesion;

treating said surface of said Al layer with a first solution of zincate containing ZnO and NaOH as major components;

immersing said surface of said Al layer in dilute $HNO_3$; and treating said surface of said Al layer with a second solution of zincate containing ZnO and NaOH as major components.

10. The method of claim 9 further comprising rinsing said surface of said Al layer with water after performing said acid etch and prior to said treating said surface with said first solution.

11. The method of claim 10 further comprising forming a thin continuous and uniform film of Zn on said surface of said Al layer, wherein a thickness of said film of Zn is on the order of about 100 nm.

12. A method for forming a semiconductor structure comprising:

providing a structure having at least one wire bond pad in contact with a metal line of an interconnect structure, said at least one wire bond pad having an exposed surface portion that is not protected by a passivation stack;

forming a metallic cap on at least the exposed upper surface portion of the wire bond pad, said metallic cap comprises a TiN seed layer with a Ti layer atop and is resistant to alkaline attack;

performing a clean/pretreatment step on said Ti layer; and forming Ni/Au metallization on said metallic cap, wherein said Ni/Au metallization comprises a Ni layer overlaid by an Au layer, said Ni layer is formed by electroless deposition of Ni, and said Au layer is formed by immersion deposition of Au followed by electroless deposition of Au wherein said Ni/Au metallization and said metallic cap do not extend onto an upper surface of said passivation stack.

13. The method of claim 12 wherein the metallic cap is formed on the exposed surface portion of the wire bond pad through an opening formed in an overlaying passivation stack.

14. The method of claim 12 wherein the metallic cap is formed atop an entire surface of a metal layer and then the metallic cap and metal layer are selectively etched to form the metallic cap on at least the exposed upper surface portion of the wire bond pad.

15. The method of claim 12 wherein said structure further includes a barrier and a lower passivation layer formed atop the interconnect structure.

16. The method of claim 12 wherein the wire bond pad is comprised of Al or an aluminum alloy.

17. The method of claim 12 wherein the TiN seed layer of the metallic cap has a thickness of about 500 Å or less, and wherein the Ti layer of the metallic cap has a thickness less than about 10000 Å.

18. The method of claim 12 further comprising bonding a wire to said Ni/Au metallization.

19. The method of claim 12 wherein a surface of said Ti layer is activated by said clean/pretreatment.

20. The method of claim 12 further comprising:

treating a surface of said Ti layer with an alkali type cleaner with a pH in the range from 7-12;

treating said surface of said Ti layer with a KCN type cleaner;

performing an HCl acid etching on said surface of said Ti layer; and treating said surface of said Ti layer with a fluorine based Pd activator.

* * * * *